(12) United States Patent
Arokiasamy et al.

(10) Patent No.: US 9,640,465 B2
(45) Date of Patent: May 2, 2017

(54) SEMICONDUCTOR DEVICE INCLUDING A CLIP

(71) Applicant: Infineon Technologies AG, Neubiberg (DE)

(72) Inventors: Xavier Arokiasamy, Teluk Intan (MY); Chun Ching Liew, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/729,672

(22) Filed: Jun. 3, 2015

(65) Prior Publication Data

US 2016/0358843 A1    Dec. 8, 2016

(51) Int. Cl.
*H01L 23/495* (2006.01)
*H01L 23/48* (2006.01)
(Continued)

(52) U.S. Cl.
CPC .... *H01L 23/49513* (2013.01); *H01L 21/4825* (2013.01); *H01L 21/50* (2013.01);
(Continued)

(58) Field of Classification Search
CPC ..... H01L 23/4093; H01L 24/72; H01L 24/90; H01L 2224/72; H01L 2224/90; H01L 21/76882; H01L 2224/0383; H01L 2224/03849; H01L 2224/1183; H01L 2224/11849; H01L 2224/2783; H01L 2224/27849; H01L 2224/80815; H01L 2224/81815; H01L 2224/81935; H01L 2224/82815; H01L 2224/83815; H01L 2224/83935; H01L 2224/84815; H01L 2224/84935; H01L 2224/85815; H01L 2224/85935; H01L 2224/80935; H01L 2224/86815; H01L 2224/48091; H01L 2224/48247; H01L 2924/01079; H01L 2924/14; H01L 2924/01029;
(Continued)

(56) References Cited

U.S. PATENT DOCUMENTS 5,015,206 A    5/1991  Dennis
6,984,792 B2   1/2006  Brofman et al.
(Continued)

OTHER PUBLICATIONS

No-Clean Solder Paste for Clip-Bonding Die-Attach, Dr. Andy Mackie, http://blogs.indium.com/blog/semiconductor packaging, Sep. 13, 2012 (3 pgs.).

*Primary Examiner* — Teresa M Arroyo
(74) *Attorney, Agent, or Firm* — Dicke, Billig & Czaja, PLLC

(57) ABSTRACT

A semiconductor device includes a lead frame including a die paddle and a lead, a semiconductor chip, and a clip. The semiconductor chip has a first side and a second side opposite to the first side. The first side is attached to the die paddle and the second side includes a first bond pad and a second bond pad. The clip electrically couples the first bond pad to the lead. The clip contacts the first bond pad at a first edge portion of the first bond pad adjacent to the second bond pad and defines a first cavity between a central portion of the first bond pad and the clip. Solder is within the first cavity to electrically couple the clip to the first bond pad. The semiconductor device includes a first opening to the first cavity to route flux away from the second bond pad during reflow soldering.

14 Claims, 5 Drawing Sheets

(51) Int. Cl.
   *H01L 23/52* (2006.01)
   *H01L 29/40* (2006.01)
   *H01L 21/48* (2006.01)
   *H01L 21/50* (2006.01)
   *H01L 23/00* (2006.01)

(52) U.S. Cl.
   CPC ........ *H01L 23/49541* (2013.01); *H01L 24/72* (2013.01); *H01L 2224/03849* (2013.01); *H01L 2224/72* (2013.01); *H01L 2224/80815* (2013.01)

(58) Field of Classification Search
   CPC ... H01L 2924/01013; H01L 2924/3011; H01L 2924/01078
   USPC ......... 257/692, 727, 775, 776, E23.086, 779
   See application file for complete search history.

(56) References Cited

U.S. PATENT DOCUMENTS

| | | |
|---|---|---|
| 7,245,011 B2 | 7/2007 | Liv |
| 7,622,796 B2 | 11/2009 | Shi et al. |
| 7,683,464 B2 | 3/2010 | Sun et al. |
| 8,142,240 B2 | 3/2012 | Oh et al. |
| 2007/0114352 A1 | 5/2007 | Victor et al. |
| 2010/0123240 A1 | 5/2010 | Sato et al. |

SEMICONDUCTOR DEVICE INCLUDING A CLIP

BACKGROUND

Power semiconductor devices may include a semiconductor chip and a lead frame. A bond pad of the semiconductor chip may be electrically coupled to a lead of the lead frame via a clip. Typically, one side of the clip is soldered to the bond pad of the semiconductor chip and the other side of the clip is soldered to the lead. During a reflow soldering process to attach the clip, solder flux may spread over the semiconductor chip and contaminate other bond pads of the semiconductor chip. This contamination may cause bond wires not to stick to the bond pads during subsequent wire bonding.

For these and other reasons, there is a need for the present invention.

SUMMARY

One embodiment includes a semiconductor device. The semiconductor device includes a lead frame including a die paddle and a lead, a semiconductor chip, and a clip. The semiconductor chip has a first side and a second side opposite to the first side. The first side is attached to the die paddle and the second side includes a first bond pad and a second bond pad. The clip electrically couples the first bond pad to the lead. The clip contacts the first bond pad at a first edge portion of the first bond pad adjacent to the second bond pad and defines a first cavity between a central portion of the first bond pad and the clip. Solder is within the first cavity to electrically couple the clip to the first bond pad. The semiconductor device includes a first opening to the first cavity to route flux away from the second bond pad during reflow soldering.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Figure 1:
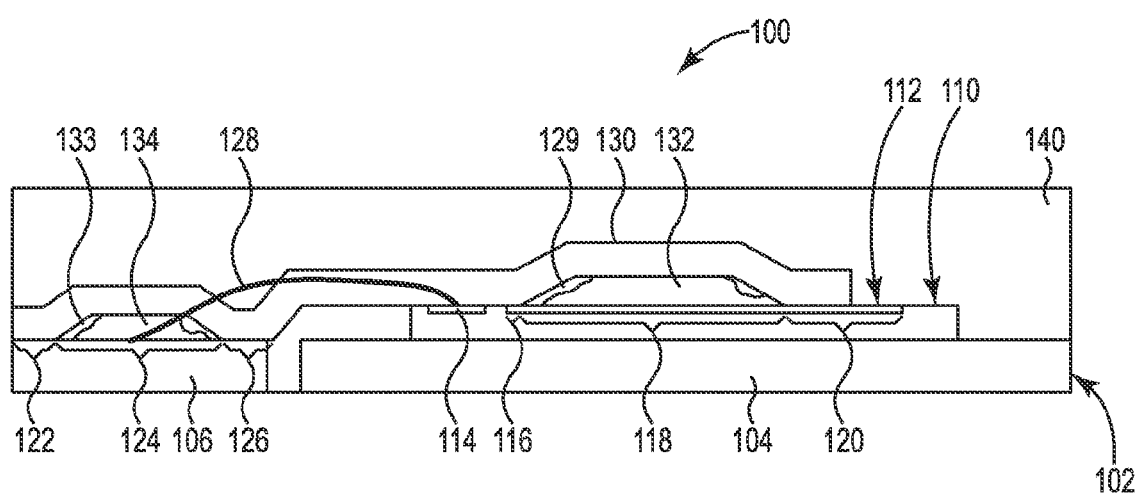
FIG. 1 illustrates one embodiment of a semiconductor device.

FIG. 1 illustrates one embodiment of a semiconductor device 100. Semiconductor device 100 includes a lead frame 102, a semiconductor chip 110, a bond wire 128, a clip 130, solder 132 and 134, and mold material 140. Lead frame 102 is made of copper or another suitable metal and includes a die paddle 104 and a lead 106. In other examples, lead frame 102 may include a plurality of leads (not shown). Mold material 140, such as a plastic material or another suitable electrically insulating material, encapsulates semiconductor chip 110, bond wire 128, clip 130, solder 132 and 134, and portions of lead frame 102 such that other portions of lead frame 102 remain exposed to provide electrical contacts to semiconductor chip 110.

In one example, semiconductor chip 110 includes a power semiconductor device, such as a power diode or a power transistor. A first side (i.e., bottom) of semiconductor chip 110 is attached to die paddle 104 via solder, an adhesive material, or other suitable material (not shown). In one example, semiconductor chip 110 is electrically coupled to die paddle 104 via the first side of semiconductor chip 110. The second side (i.e., top) of semiconductor chip 110 opposite to the first side includes a first bond pad 112 and a second bond pad 114. In other examples, semiconductor chip 110 may include additional bond pads (not shown). First bond pad 112 and second bond pad 114 are made of copper or another suitable metal. First bond pad 112 is electrically coupled to lead 106 via solder 132, clip 130, and solder 134. Second bond pad 114 is electrically coupled to lead 106 or to another lead (not shown) via bond wire 128. Bond wire 128 may be made of copper, gold, or another suitable metal.

Clip 130 is configured to prevent solder flux from contaminating bond pad 114 during reflow soldering. Clip 130 may be made of copper or another suitable metal. In one example, clip 130 is shaped by stamping to provide a first cavity 129 between the clip and a central portion 118 of first bond pad 112 and to provide a second cavity 133 between the clip and a central portion 124 of lead 106. Clip 130 contacts first bond pad 112 at a first edge portion 116 adjacent to second bond pad 114 and at a second edge portion 120 opposite to first edge portion 116. Clip 130 also contacts lead 106 at a first edge portion 122 and at a second edge portion 126 opposite to first edge portion 122. First cavity 129 contains solder 132 electrically coupling clip 130 to central portion 118 of first bond pad 112. Second cavity 133 contains solder 134 electrically coupling clip 130 to central portion 124 of lead 106. With clip 130 contacting first edge portion 116 of first bond pad 112, solder flux is prevented from spreading over second bond pad 114 during reflow soldering. Rather, due to the configuration of clip 130, solder flux is routed away from second bond pad 114 during reflow soldering as will be described in more detail below with reference to FIGS. 2A-4B.

Figure 2A:
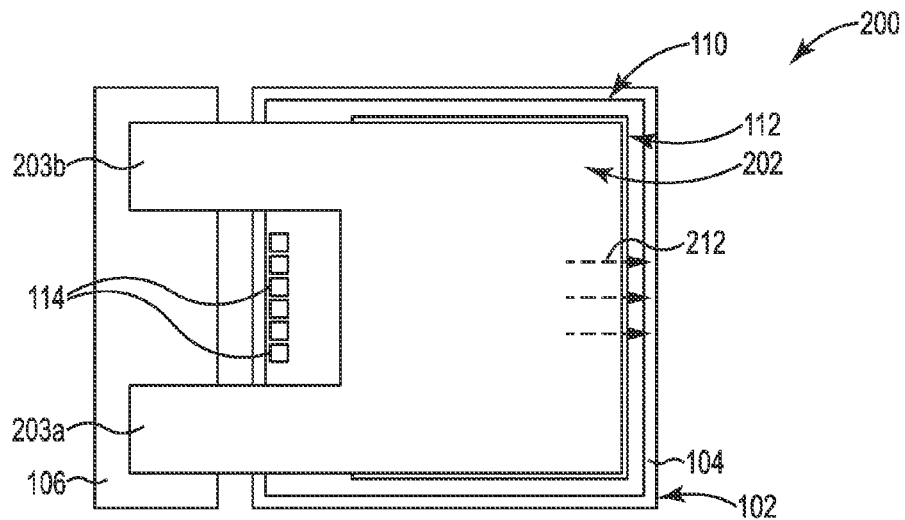
FIGS. 2A-2D illustrate various views of one embodiment of a semiconductor device.
Figure 2B:
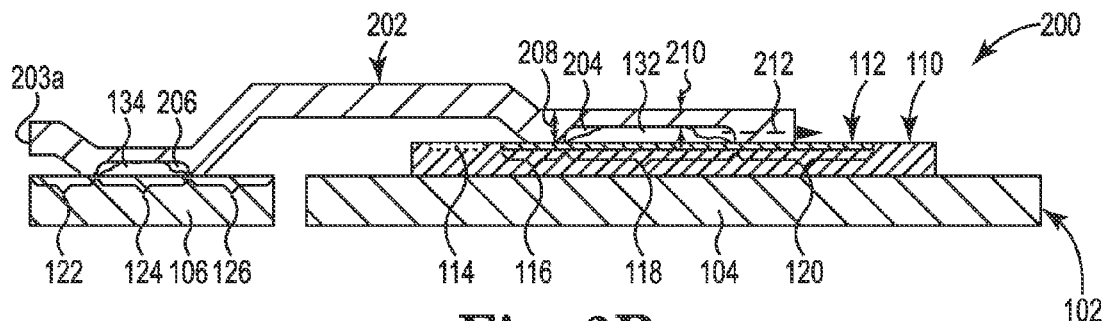
Figure 2C:
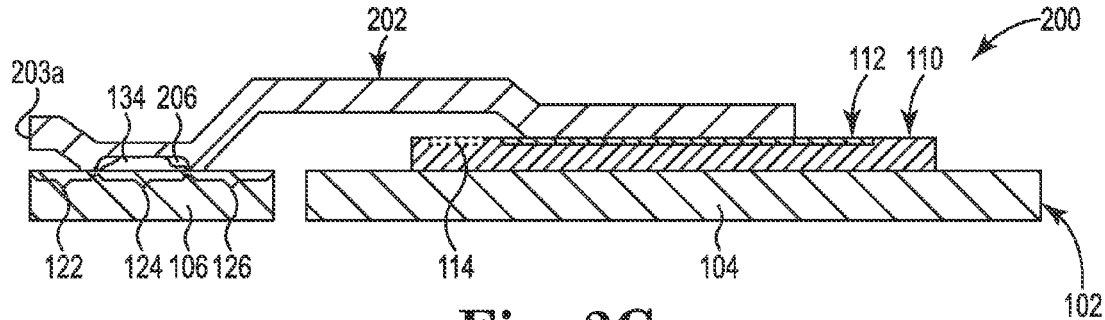
Figure 2D:
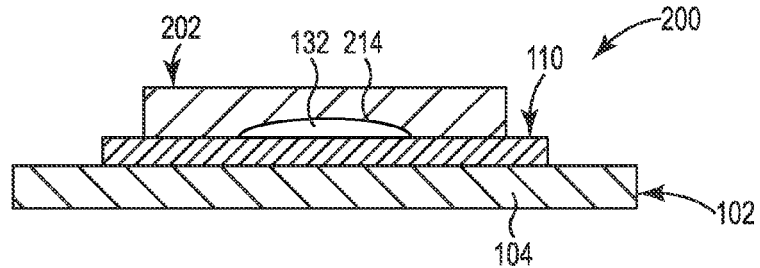

FIGS. 2A-2D illustrate various views of one embodiment of a semiconductor device 200. FIG. 2A illustrates a top view, FIG. 2B illustrates a cross-sectional view, FIG. 2C illustrates a first side view, and FIG. 2D illustrates a second side view perpendicular to the first side view. Semiconductor device 200 includes a lead frame 102, a semiconductor chip 110, a clip 202, and solder 132 and 134. Bond wires and mold material have been excluded from FIGS. 2A-2D for simplicity. Lead frame 102 includes a die paddle 104 and a lead 106. A first side (i.e., bottom) of semiconductor chip 110 is attached to die paddle 104. The second side (i.e., top) of semiconductor chip 110 opposite to the first side includes a first bond pad 112 and a plurality of second bond pads 114 adjacent to first bond pad 112. First bond pad 112 is electrically coupled to lead 106 via solder 132, clip 202, and solder 134.

Clip 202 is configured to prevent solder flux from contaminating bond pads 114 during reflow soldering. As illustrated in FIG. 2B, clip 202 contacts first bond pad 112 at a first edge portion 116 adjacent to second bond pads 114 and at a second edge portion 120 opposite to first edge portion 116. Clip 202 also contacts lead 106 at a first edge portion 122 and at a second edge portion 126 opposite to first edge portion 122. In this example, clip 202 has a varying thickness in a direction perpendicular to semiconductor chip 110 between a first thickness indicated for example at 208 at first edge portion 116 of bond pad 112 and a second thickness indicated for example at 210 at a central portion 118 of bond pad 112 to define a first cavity 204 (e.g., a half edge sink hole) between the clip and central portion 118 of first bond pad 112. First cavity 204 extends between first edge portion 116 of first bond pad 112 and second edge portion 120 of first bond pad 112. Similarly, the thickness of clip 202 varies to define two second cavities 206 between a first portion 203a of the clip and a central portion 124 of lead 106 and between a second portion 203b of the clip and the central portion 124 of lead 106. Each second cavity 206 extends between first edge portion 122 of lead 106 and second edge portion 126 of lead 106.

First cavity 204 contains solder 132 electrically coupling clip 202 to central portion 118 of first bond pad 112. Second cavities 206 contain solder 134 electrically coupling first portion 203a and second portion 203b of clip 202 to central portion 124 of lead 106. As illustrated in the side view of FIG. 2C, the sides of first portion 203a and second portion 203b of clip 202 perpendicular to the first edge portion 122 of lead 106 define openings to route excess solder and/or solder flux out of the respective second cavities 206 during reflow soldering in a direction parallel to first edge portion 122 of lead 106. Also as illustrated in FIG. 2C, the sides of clip 202 perpendicular to first edge portion 116 of bond pad 112 contact first bond pad 112 to enclose cavity 204. As illustrated in FIG. 2D, clip 202 defines an opening 214 to route excess solder and/or solder flux out of cavity 204 during reflow soldering in the direction indicated by arrows 212 (i.e., in a direction perpendicular to first edge portion 116). Opening 214 extends from the central portion 118 of first bond pad 112 to the second edge portion 120 of first bond pad 112. With clip 202 contacting first edge portion 116 of first bond pad 112, solder flux is prevented from spreading over second bond pads 114 during reflow soldering. Rather, as indicated by arrows 212, excess solder and/or solder flux is routed away from second bond pads 114 through opening 214 during reflow soldering to prevent contamination of second bond pads 114.

Figure 3A:
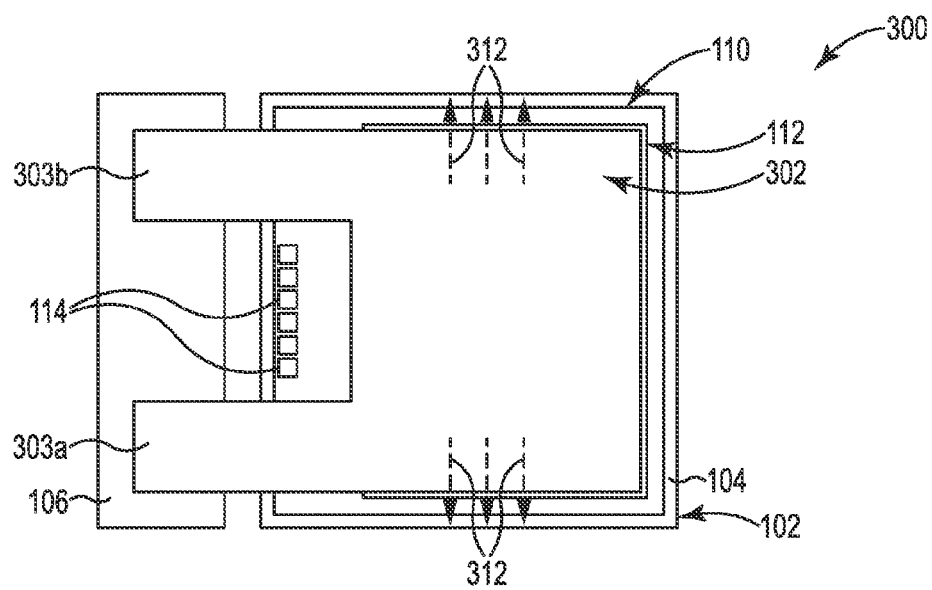
FIGS. 3A and 3B illustrate a top view and a cross-sectional view, respectively, of another embodiment of a semiconductor device.
Figure 3B:
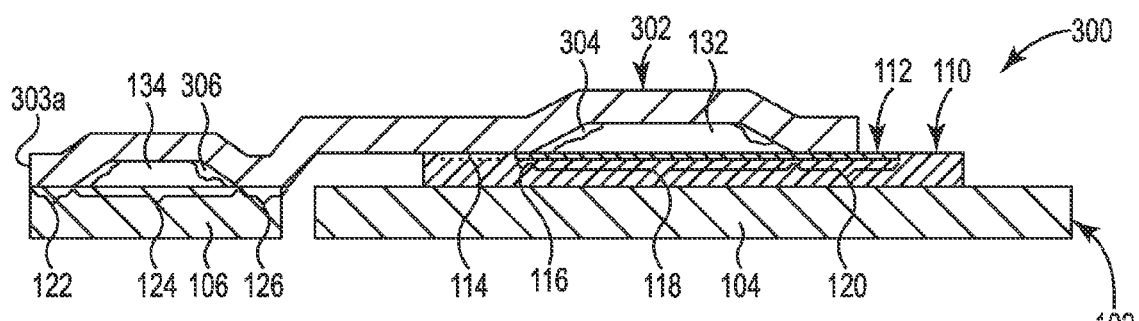

FIGS. 3A and 3B illustrate a top view and a cross-sectional view, respectively, of another embodiment of a semiconductor device 300. Semiconductor device 300 includes a lead frame 102, a semiconductor chip 110, a clip 302, and solder 132 and 134. Bond wires and mold material have been excluded from FIGS. 3A and 3B for simplicity. Lead frame 102 includes a die paddle 104 and a lead 106. A first side (i.e., bottom) of semiconductor chip 110 is attached to die paddle 104. The second side (i.e., top) of semiconductor chip 110 opposite to the first side includes a first bond pad 112 and a plurality of second bond pads 114 adjacent to first bond pad 112. First bond pad 112 is electrically coupled to lead 106 via solder 132, clip 302, and solder 134.

Clip 302 is configured to prevent solder flux from contaminating bond pads 114 during reflow soldering. As illustrated in FIG. 3B, clip 302 contacts first bond pad 112 at a first edge portion 116 adjacent to second bond pads 114 and at a second edge portion 120 opposite to first edge portion 116. Clip 302 also contacts lead 106 at a first edge portion 122 and at a second edge portion 126 opposite to first edge portion 122. In this example, clip 302 has a single thickness and is shaped to define a first cavity 304 between the clip and a central portion 118 of first bond pad 112. First cavity 304 extends between first edge portion 116 of first bond pad 112 and second edge portion 120 of first bond pad 112. Similarly, clip 302 is shaped to define two second cavities 306 between a first portion 303a of the clip and a central portion 124 of lead 106 and between a second portion 303b of the clip and the central portion 124 of lead 106. Each second cavity 306 extends between first edge portion 122 of lead 106 and second edge portion 126 of lead 106.

First cavity 304 contains solder 132 to electrically couple clip 302 to central portion 118 of first bond pad 112. Second cavities 306 contain solder 134 to electrically couple first portion 303a and second portion 303b of clip 302 to central portion 124 of lead 106. As illustrated in FIG. 3B, the sides of first portion 303a and second portion 303b of clip 302 perpendicular to first edge portion 122 of lead 106 define openings to route excess solder and/or solder flux out of the respective second cavities 306 during reflow soldering in a direction parallel to first edge portion 122 of lead 106. Also as illustrated in FIG. 3B, the sides of clip 302 perpendicular to first edge portion 116 of bond pad 112 define openings to route excess solder and/or solder flux out of cavity 304 in a direction parallel to first edge portion 116 during reflow soldering as indicated by arrows 312. With clip 302 contacting first edge portion 116 of first bond pad 112, solder flux is prevented from spreading over second bond pads 114 during reflow soldering. Rather, as indicated by arrows 312, excess solder and/or solder flux is routed away from second bond pads 114 through the openings on each end of cavity 304 during reflow soldering to prevent contamination of second bond pads 114.

Figure 4A:
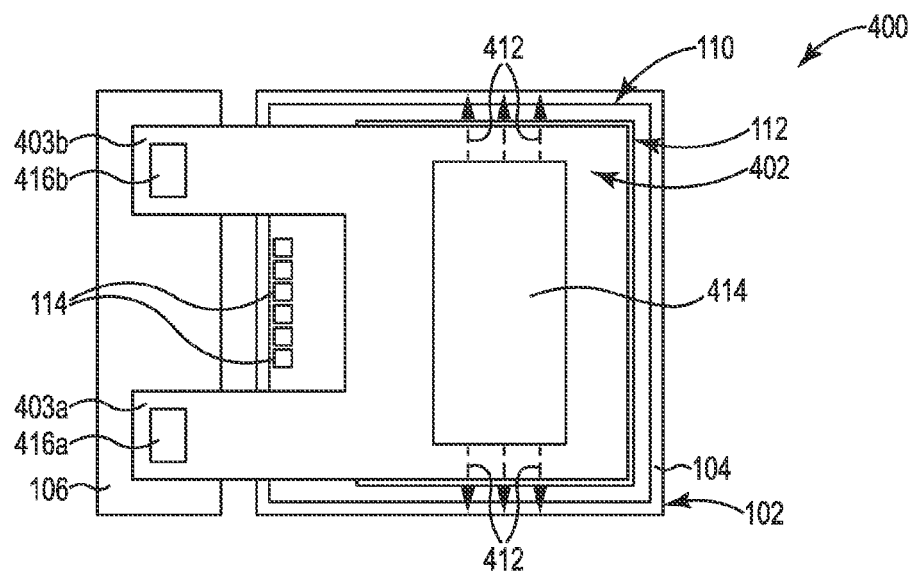
FIGS. 4A and 4B illustrate a top view and a cross-sectional view, respectively, of another embodiment of a semiconductor device.
Figure 4B:
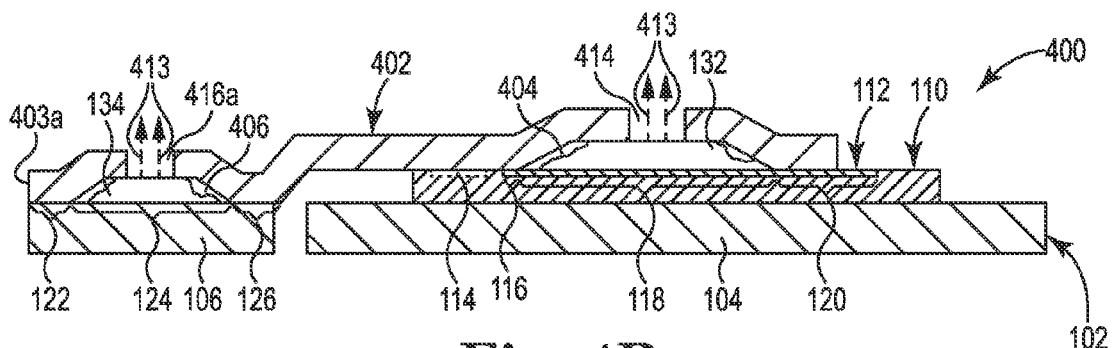

FIGS. 4A and 4B illustrate a top view and a cross-sectional view, respectively, of another embodiment of a semiconductor device 400. Semiconductor device 400 includes a lead frame 102, a semiconductor chip 110, a clip 402, and solder 132 and 134. Bond wires and mold material have been excluded from FIGS. 4A and 4B for simplicity. Lead frame 102 includes a die paddle 104 and a lead 106. A first side (i.e., bottom) of semiconductor chip 110 is attached to die paddle 104. The second side (i.e., top) of semiconductor chip 110 opposite to the first side includes a first bond pad 112 and a plurality of second bond pads 114 adjacent to first bond pad 112. First bond pad 112 is electrically coupled to lead 106 via solder 132, clip 402, and solder 134.

Clip 402 is configured to prevent solder flux from contaminating bond pads 114 during reflow soldering. As illustrated in FIG. 4B, clip 402 contacts first bond pad 112 at a first edge portion 116 adjacent to second bond pads 114 and at a second edge portion 120 opposite to first edge portion 116. Clip 402 also contacts lead 106 at a first edge portion 122 and at a second edge portion 126 opposite to first edge portion 122. In this example, clip 402 has a single thickness and is shaped to define a first cavity 404 between the clip and a central portion 118 of first bond pad 112. First cavity 404 extends between first edge portion 116 of first bond pad 112 and second edge portion 120 of first bond pad 112. Similarly, clip 402 is shaped to define two second cavities 406 between a first portion 403a of the clip and a central portion 124 of lead 106 and between a second portion 403b of the clip and the central portion 124 of lead 106. Each second cavity 406 extends between first edge portion 122 of lead 106 and second edge portion 126 of lead 106.

First cavity 404 contains solder 132 to electrically couple clip 402 to central portion 118 of first bond pad 112. Second cavities 406 contain solder 134 to electrically couple first portion 403a and second portion 403b of clip 402 to central portion 124 of lead 106. As illustrated in FIG. 4B, the sides of first portion 403a and second portion 403b of clip 402 perpendicular to first edge portion 122 of lead 106 define openings to route excess solder and/or solder flux out of the respective second cavities 406 during reflow soldering in a direction parallel to first edge portion 122 of lead 106. Also as illustrated in FIG. 4B, the sides of clip 402 perpendicular to first edge portion 116 of bond pad 112 define openings to route excess solder and/or solder flux out of cavity 404 in a direction parallel to first edge portion 116 during reflow soldering as indicated by arrows 412.

Clip 402 also includes a first opening 414 and second openings 416a and 416b extending through the clip in a direction perpendicular to semiconductor chip 110 and lead frame 102 to route excess solder and/or solder flux out of cavities 404 and 406, respectively, in the vertical direction during reflow soldering as indicated by arrows 413. With clip 402 contacting first edge portion 116 of first bond pad 112, solder flux is prevented from spreading over second bond pads 114 during reflow soldering. Rather, as indicated by arrows 412 and 413, excess solder and/or solder flux is routed away from second bond pads 114 through the openings on each end of cavity 404 and through opening 414 during reflow soldering to prevent contamination of second bond pads 114.

Figure 5:
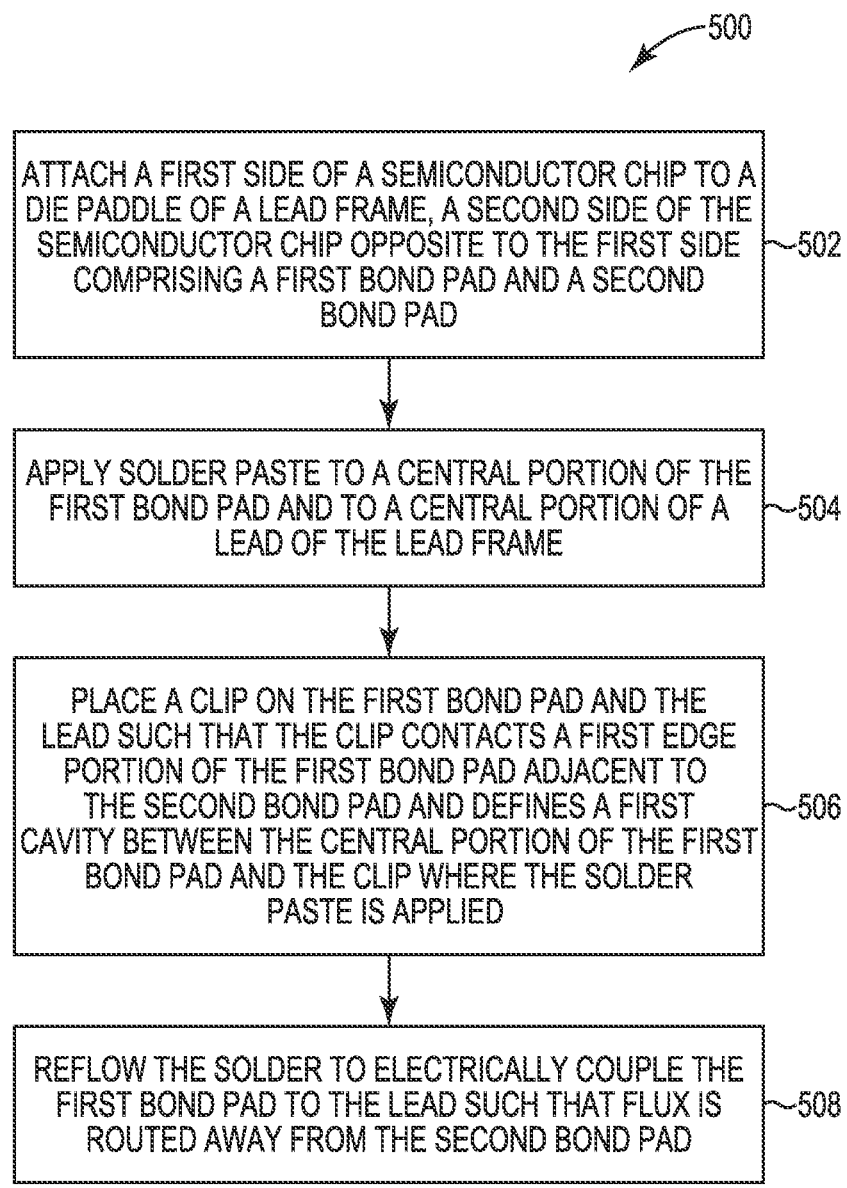
FIG. 5 is a flow diagram illustrating one embodiment of a method for fabricating a semiconductor device.

FIG. 5 is a flow diagram illustrating one embodiment of a method 500 for fabricating a semiconductor device, such as semiconductor device 200, 300, or 400 previously described and illustrated with reference to FIGS. 2A-4B. At 502, a first side of a semiconductor chip is attached to a die paddle of a lead frame, where a second side of the semiconductor chip opposite to the first side comprises a first bond pad and a second bond pad. At 504, solder paste is applied to a central portion of the first bond pad and to a central portion of a lead of the lead frame. At 506, a clip is placed on the first bond pad and the lead such that the clip contacts a first edge portion of the first bond pad adjacent to the second bond pad and defines a first cavity between the central portion of the first bond pad and the clip where the solder paste is applied. At 508, the solder is reflowed to electrically couple the first bond pad to the lead such that flux is routed away from the second bond pad.

In one example, placing the clip comprises placing the clip such that the clip contacts a first edge portion of the lead and defines a second cavity between a central portion of the lead and the clip where the solder paste is applied. In another example, reflowing the solder comprises reflowing the solder such that flux is routed through an opening extending from the central portion of the first bond pad to a second edge portion of the first bond pad opposite to the first edge portion of the first bond pad. In another example, reflowing the solder comprises reflowing the solder such that flux is routed through an opening that extends perpendicular to the first edge portion of the first bond pad. In another example, reflowing the solder comprises reflowing the solder such that flux is routed through an opening that extends through the clip at the central portion of the first bond pad and perpendicular to the semiconductor chip.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
a lead frame comprising a die paddle and a lead;
a semiconductor chip having a first side and a second side opposite to the first side, the first side attached to the die paddle and the second side comprising a first bond pad and a second bond pad;
a clip electrically coupling the first bond pad to the lead, the clip contacting the first bond pad at a first edge portion of the first bond pad adjacent to the second bond pad and defining a first cavity between a central portion of the first bond pad and the clip;
solder within the first cavity electrically coupling the clip to the first bond pad; and a first opening to the first cavity defined by the clip, the first opening extending from an edge portion of the first bond pad other than the first edge portion, the first opening to route flux away from the second bond pad during reflow soldering.

2. The semiconductor device of claim 1, wherein the first opening is defined by the clip and extends from the central portion of the first bond pad to a second edge portion of the first bond pad opposite to the first edge portion of the first bond pad.

3. The semiconductor device of claim 1, wherein the first opening is defined by the clip to route flux parallel to the first edge portion of the first bond pad during reflow soldering.

4. The semiconductor device of claim 1, wherein a thickness of the clip in a direction perpendicular to the semiconductor chip varies from the first edge portion of the first bond pad to the central portion of the first bond pad to define the first cavity.

5. The semiconductor device of claim 1, wherein the clip has a single thickness and is shaped to define the first cavity.

6. The semiconductor device of claim 1, wherein the clip contacts the lead at a first edge portion of the lead and defines a second cavity between a central portion of the lead and the clip, the semiconductor device further comprising: a second opening to the second cavity to route flux out of the second cavity during reflow soldering.

7. The semiconductor device of claim 6, wherein the second opening is defined by the clip to route flux parallel to the first edge portion of the lead during reflow soldering.

8. The semiconductor device of claim 6, wherein a thickness of the clip in a direction perpendicular to the lead varies from the first edge portion of the lead to the central portion of the lead to define the second cavity.

9. The semiconductor device of claim 6, wherein the clip has a single thickness and is shaped to define the second cavity.

10. A method for fabricating the semiconductor device of claim 1, the method comprising:
attaching a first side of a semiconductor chip to a die paddle of a lead frame, a second side of the semiconductor chip opposite to the first side comprising a first bond pad and a second bond pad;
applying solder paste to a central portion of the first bond pad and to a central portion of a lead of the lead frame;
placing a clip on the first bond pad and the lead such that the clip contacts a first edge portion of the first bond pad adjacent to the second bond pad and defines a first cavity between the central portion of the first bond pad and the clip where the solder paste is applied; and reflowing the solder to electrically couple the first bond pad to the lead such that flux is routed away from the second bond pad.

11. The method of claim 10, wherein placing the clip comprises placing the clip such that the clip contacts a first edge portion of the lead and defines a second cavity between a central portion of the lead and the clip where the solder paste is applied.

12. The method of claim 10, wherein reflowing the solder comprises reflowing the solder such that flux is routed through an opening extending from the central portion of the first bond pad to a second edge portion of the first bond pad opposite to the first edge portion of the first bond pad.

13. The method of claim 10, wherein reflowing the solder comprises reflowing the solder such that flux is routed through an opening that extends perpendicular to the first edge portion of the first bond pad.

14. The method of claim 10, wherein reflowing the solder comprises reflowing the solder such that flux is routed through an opening that extends through the clip at the central portion of the first bond pad and perpendicular to the semiconductor chip.

* * * * *